United States Patent
Quy

(10) Patent No.: US 11,280,846 B1
(45) Date of Patent: Mar. 22, 2022

(54) VOLTAGE QUALITY MONITOR

(71) Applicant: Rosemount Aerospace Inc., Burnsville, MN (US)

(72) Inventor: Dennis A. Quy, Apple Valley, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 0 days.

(21) Appl. No.: 17/012,015

(22) Filed: Sep. 3, 2020

(51) Int. Cl.
*G01R 31/40* (2020.01)
*G01R 19/165* (2006.01)

(52) U.S. Cl.
CPC ....... *G01R 31/40* (2013.01); *G01R 19/16528* (2013.01); *G01R 19/16538* (2013.01)

(58) Field of Classification Search
CPC .............. G01R 31/40; G01R 19/16538; G01R 19/16528
See application file for complete search history.

(56) References Cited

U.S. PATENT DOCUMENTS 5,498,972 A * 3/1996 Haulin ............ G01R 19/16552
324/103 P
9,948,087 B2 4/2018 Haines et al.

* cited by examiner

*Primary Examiner* — Farhana A Hoque
(74) *Attorney, Agent, or Firm* — Kinney & Lange, P.A.

(57) ABSTRACT

A system for monitoring the quality of voltage supplied by a power supply includes a voltage variation detection module and a controller. The voltage variation detection module has one or more level detection circuits that each receive a signal indicating the supplied voltage, thereby producing an amplitude signal representing a temporal variation in the voltage during a capture interval. The controller determines the capture interval, provides a capture control signal that causes the level detection circuit(s) to receive the voltage during the capture interval, receives the respective amplitude signal(s) from each of the level detection circuit(s), and produces one or more output signals, each representing the amplitude signal(s) and the associated capture interval, thereby providing an indication of the voltage quality. A method of using the system is also disclosed.

20 Claims, 4 Drawing Sheets

VOLTAGE QUALITY MONITOR

BACKGROUND

The present disclosure relates generally to electrical power supplies, and more particularly, to the monitoring of the quality of voltage that is provided by a power supply.

Power supplies are used in electronic systems for producing a regulated direct current (DC) voltage for various electronic circuits. Typically, a loosely regulated bus provides the source of electrical power for various power supplies and these power supplies convert the electrical power to lower DC voltages that are regulated. These power supplies can be referred to as a regulated power supplies, and they are designed to maintain output DC voltages that are within particular tolerances of nominal target voltages. The proper operation of many electrical circuits is predicated on the supplied voltage being within a specified tolerance value of a nominal voltage. An exemplary regulated power supply can provide 5 volts±10%, meaning that the power supply is expected to provide an output voltage that ranges from 4.5-5.5 volts. This voltage range can be referred to as an allowable voltage range. Some existing systems can monitor an output voltage that is produced by a power supply while producing an error signal when the output voltage is outside of the allowable voltage range. This monitoring circuit can be referred to as a voltage level monitoring circuit.

An example of a modern power supply is a switching power supply, in which an output voltage is produced by modulating connection to an input voltage or modulating a charge injection, for example. For example, a switching power supply can use pulse-width modulation having a pulse repetition frequency of about 100 KHz. This is referred to as the switching frequency. A switching power supply, when new, is designed to filter the output voltage to mitigate the effect of the switching frequency. As components of the power supply are subjected to degradation over their lifetime, effects of the switching frequency on the output voltage can become more pronounced. For example, a ripple voltage having a frequency corresponding to the switching frequency can be present on the output voltage supplied by the power supply, and this can adversely affect circuit components that are supplied by the power supply and/or the performance thereof. The ripple frequency can be equivalent to the switching frequency and/or to a harmonic of the switching frequency. A typical voltage level monitoring circuit will not detect these adverse effects if the instantaneous output voltage remains within the tolerance band.

A phenomenon known as subharmonic oscillation can occur at one or more frequencies that are below the switching frequency. Subharmonic oscillation can be difficult to predict because it can result from changes in connected loads and/or from the degradation of components in the power supply and/or in the connected loads. Subharmonic oscillation can adversely affect circuit components that are supplied by the power supply and/or the performance thereof. A typical voltage level monitoring circuit will not detect subharmonic oscillation if the instantaneous output voltage remains within the tolerance band.

Power supply outputs can also be susceptible to transient pulses, noise spikes, and so on. These transients can occur from various causes including load switching, electromagnetic interference, and electrostatic discharge. A typical voltage level monitoring circuit will not detect transients if the instantaneous output voltage remains within the tolerance band. The aforementioned effects are examples of undesirable fluctuations that can occur in the output voltage that is provided by a power supply. These fluctuations, while remaining within the allowable voltage range, can have undesirable effects on connected loads. Moreover, these undesirable effects can increase over the lifetime of a power supply, even though the output voltage level remains within a design tolerance band, thereby not being detected by a voltage level monitoring circuit. Accordingly, there is a need for a system that can monitor for undesirable fluctuations in an output voltage provided by a power supply, thereby providing an indication that the quality of a supplied voltage is degrading.

SUMMARY

A system for monitoring the quality of a voltage supplied by a power supply includes a voltage variation detection module and a controller. The voltage variation detection module has one or more level detection circuits, each configured to receive a signal indicative of the voltage supplied by the power supply and produce an amplitude signal representative of a temporal variation in the voltage occurring during a capture interval. The controller is configured to determine the capture interval, provide a capture control signal configured to cause the one or more level detection circuits to receive the signal indicative of the voltage during the capture interval, receive each of the respective amplitude signals from each of the one or more level detection circuits, and produce one or more output signals that is representative of the respective amplitude signals and the associated capture interval, thereby providing an indication of the quality of the voltage.

A method to monitor the quality of a voltage supplied by a power supply uses a system having a controller and a voltage variation detection module that includes one or more level detection circuits includes determining a capture interval by the controller, providing an indication of the capture interval to each of the one or more level detection circuits, receiving a signal indicative of the voltage during the capture interval determined by the one or more level detection circuits, producing an amplitude signal representative of a temporal variation in the voltage occurring during the capture interval by the one or more level detection circuits, receiving the one or more amplitude signals by the controller, and producing one or more output signals that are representative of the amplitude signals and the associated capture interval, thereby providing an indication of the quality of the voltage.

DETAILED DESCRIPTION

Figure 1A:
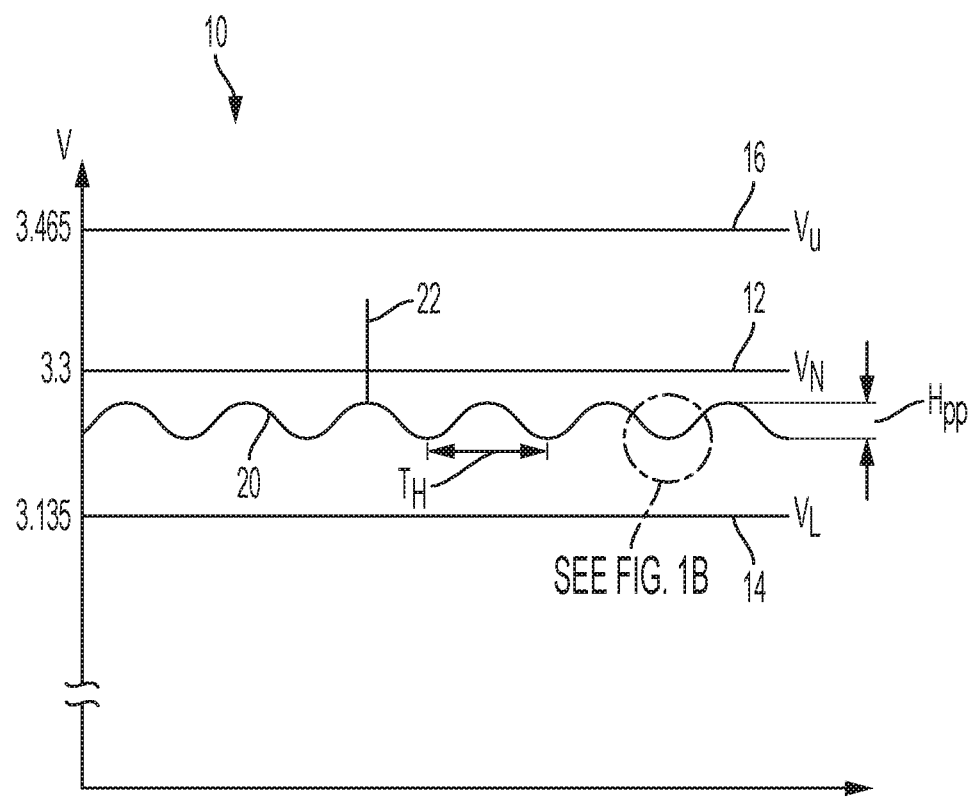
FIG. 1A is a plot of output voltage from a monitored power supply.
Figure 1B:
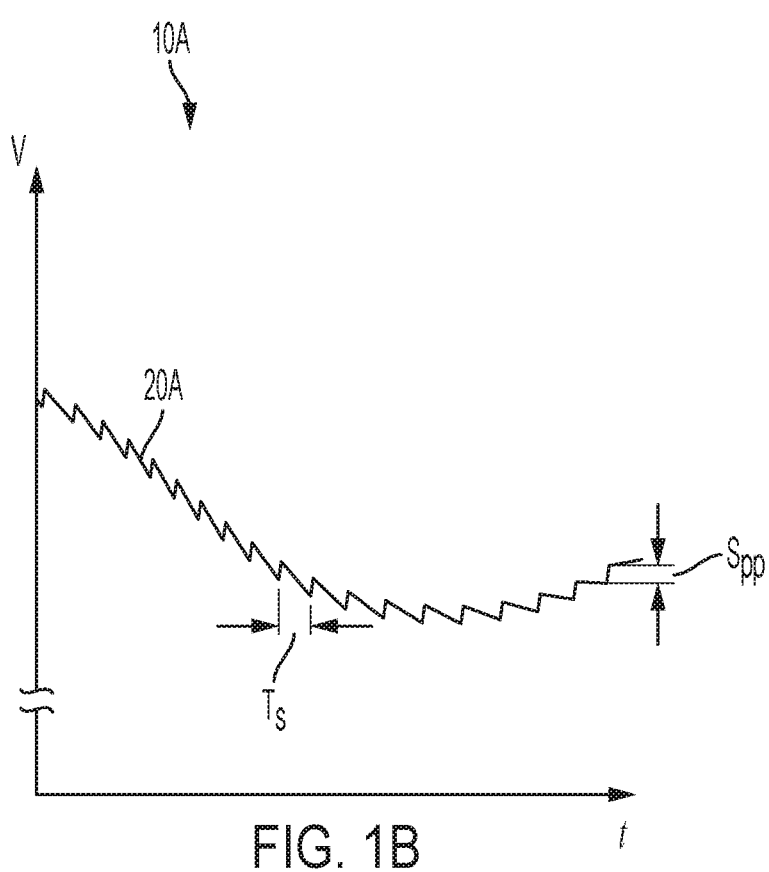
FIG. 1B is an enlargement of a portion of the plot shown in FIG. 1A.

FIG. 1A is a plot of output voltage from a monitored power supply. FIG. 1B is an enlargement of a portion of the plot shown in FIG. 1A. FIGS. 1A-1B will be described together. Shown in FIGS. 1A-1B are voltage vs. time plots 10, 10A, nominal voltage level 12 labeled $V_N$, lower voltage limit 14 labeled $V_L$, upper voltage limit 16 labeled $V_U$, voltage traces 20, 20A, and noise spike 22. These variations can be referred to as temporal variations (i.e., as shown on a time-axis plot). Also labeled in FIGS. 1A-1B are subharmonic period $T_H$, subharmonic peak-to-peak (pp) amplitude $H_{PP}$, switching period $T_S$, and switching ripple pp amplitude $S_{PP}$. Voltage traces 20, 20A are produced by a power supply (not shown in FIGS. 1A-1B) that is designed to provide nominal voltage level 12. In the illustrated embodiment, nominal voltage level 12 ($V_N$) is 3.3 volts with a tolerance of ±5%. Accordingly, lower voltage limit 14 ($V_L$) is 3.135 volts and upper voltage limit 16 ($V_U$) is 3.465 volts. Noise spike 22 is a fast voltage excursion from the cyclical waveform of voltage trace 20. Noise spike 22 can be referred to as a transient. Non-limiting causes of noise spike 22 (i.e., transient) can be load switching, electromagnetic interference, and electrostatic discharge. As shown by voltage vs. time plot 10 in FIG. 1A, the power supply output voltage level is between lower voltage limit 14 ($V_L$) and upper voltage limit 16 ($V_U$) throughout the illustrated period of time. Accordingly, the power supply can be said to be providing an output voltage that is within the designed tolerance band.

Voltage trace 20 shown in FIG. 1A depicts subharmonic oscillation, a phenomenon that can result from feedback between a power supply and one or more connected loads. In a switching power supply, subharmonic oscillation is so named because the oscillation frequency is generally below a frequency that is associated with the switching power supply (i.e., switching frequency). Instabilities (i.e., oscillations) can occur in all types of power supplies, with a linear power supply being a nonlimiting example of a non-switching power supply. These instabilities can be caused by various factors regardless of the type of power supply. Accordingly, as used in this disclosure, "subharmonic oscillation" will be used to refer to a power supply instability regardless of whether or not a higher switching frequency is used in the power supply. Referring to FIG. 1A, the subharmonic oscillation has subharmonic period $T_H$ and subharmonic pp amplitude $H_PP$. The subharmonic oscillation frequency ($F_H$) is the inverse of subharmonic period $T_H$ (i.e., $1/T_H$). Exemplary subharmonic oscillation frequencies ($F_H$) range from 200-5,000 Hz but can be below or above this range in various embodiments. In some embodiments, subharmonic oscillation can occur at two or more subharmonic oscillation frequencies ($F_H$). In the illustrated embodiment, subharmonic pp amplitude $H_{PP}$ is about 0.040 volts (40 millivolts) In various embodiments, subharmonic pp amplitude $H_{PP}$ can be less than or greater than this exemplary value. Subharmonic oscillation can be difficult to predict because it can result from changes in connected loads and/or from the degradation of components in the power supply and/or in the connected loads. In some cases, parasitic reactive values (e.g., capacitance, inductance) within the system circuitry can also result in subharmonic oscillation. Subharmonic oscillation can adversely affect circuit components that are supplied by the power supply and/or the performance thereof. Subharmonic oscillation frequency ($F_H$) and/or subharmonic pp amplitude $H_{PP}$ can vary under different load configurations and/or over time. The ageing of power supply components over the service life of the power supply can contribute to subharmonic oscillation. Subharmonic oscillation can introduce adverse performance, detector errors, and so on in circuit components that are supplied by the power supply, even though the power supply output voltage remains within the tolerance band.

An exemplary power supply is a switching power supply in which an output voltage is produced by modulating (i.e., switching) connection to an input voltage or modulating a charge injection, etc. A non-limiting example of a switching power supply can use pulse-width modulation having a pulse repetition frequency of about 100 KHz. This is referred to as the switching frequency. Voltage trace 20A shown in FIG. 1B depicts the ripple that can occur on the power supply output voltage caused by the switching frequency. This can be referred to as power supply switching ripple. In the illustrated embodiment, switching period $T_S$ is about 10 microseconds (10 μsec), being the inverse of a switching frequency of 100 KHz, and switching ripple pp amplitude $S_{PP}$ is about 1 microvolt (1 μv). Moreover, in the illustrated embodiment whereby subharmonic oscillation and power supply switching ripple are both present, the power supply switching ripple (shown in FIG. 1B) rides on the subharmonic oscillation shown in FIG. 1A. A switching power supply, when new, is designed to filter the output voltage to mitigate the effect of the switching frequency. As components of the power supply are subjected to degradation over their lifetime, effects of the switching frequency on the output voltage can become more pronounced. Under some conditions, a ripple voltage having a frequency corresponding to the switching frequency can be present on the output voltage supplied by the power supply, and this can adversely affect circuit components that are supplied by the power supply and/or the performance thereof. In some cases, the ripple frequency can be equivalent to the switching frequency. In other cases, one or more harmonics of the switching frequency can also be present on the output voltage supplied by the power supply. These frequencies can introduce adverse performance, detector errors, and so on in circuit components that are supplied by the power supply, even though the power supply output voltage remains within the tolerance band. In some embodiments, the power supply switching frequency can range from about 1 KHz-2 MHz. In other embodiments, the power supply switching frequency can be less than 1 KHz or greater than 2 MHz. In yet other embodiments, the power supply switching frequency can be variable, for example, in a switching power supply that uses a frequency modulation switching scheme.

In some embodiments, the power supply can receive an input voltage (i.e., bus voltage) that is an alternating current (AC) voltage. In these embodiments, exemplary AC bus frequencies are 50 Hz, 60 Hz, and 400 Hz. In other embodiments, the AC frequency can be different from these exemplary values. In any of these embodiments, the AC bus frequency and/or its harmonics can be present on the power supply output voltage.

Referring again to FIGS. 1A-1B, the frequencies and/or amplitudes of the variations in power supply output voltage can be described as cyclic and/or spurious variations in the power supply output voltage level. The characteristics of the cyclic and/or spurious variations in the power supply output voltage level can be referred to as the quality of the power supply voltage, in which greater variation in power supply output voltage level is associated with a lower quality of the power supply voltage. As the power supply and/or connected circuits (i.e., loads) change over time, various frequencies can shift and/or new frequencies can occur. Moreover, the amplitudes of any of these frequencies can increase. Accordingly, the quality of the power supply voltage can be said to degrade. An exemplary cause of power supply voltage degradation is component ageing. An electrolytic capacitor is a non-limiting example of a component that can be susceptible to ageing, resulting in a degradation of that component over time. Other causes of power supply voltage degradation include loose or intermittent connections on power supply components and/or circuit boards, which can be caused by ageing, shock, and/or vibration. Liquid and/or particulate contamination on circuit components and/or conductive traces, loose connections, and cracks in circuit boards can result in power supply voltage quality degradation. These factors can be exasperated by thermal conditions, shock, vibration, humidity, and other environmental factors. In some cases, the effect of these factors can be sporadic or intermittent, occurring under only certain conditions. For example, materials that are used in the construction of power supplies and components thereof can have differing coefficients of thermal expansion which can contribute to the aforementioned problems at various temperatures and/or during temperature transients.

In the illustrated embodiment, the power supply produces an output voltage (i.e., nominal voltage level ($V_N$)) of 3.3 volts. In some embodiments, the output voltage can range from about 0.9-100 volts. Exemplary power supply output voltages include 5 volts and 12 volts. In other embodiments, the power supply output voltage can be less than 0.9 volts or more than 100 volts. In the illustrated embodiment, the power supply output voltage had a tolerance band of +5%. In some embodiments, the tolerance band can be tighter than or looser than +5%. Exemplary tolerance bands include ±2%, ±10%, and ±20%. In some embodiments, the tolerance band can be asymmetrical.

Figure 2:
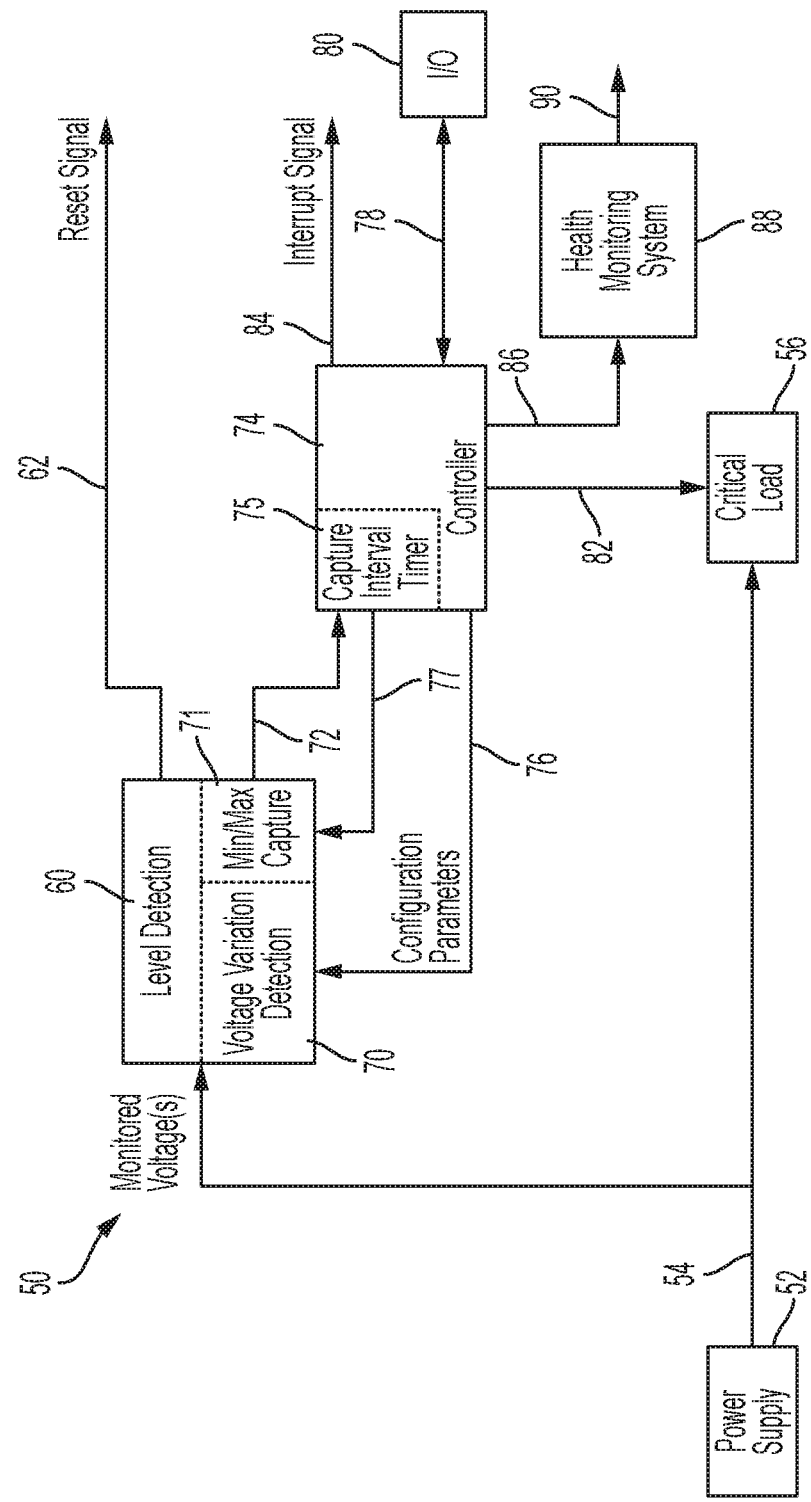
FIG. 2 is a schematic block diagram of a voltage quality monitoring circuit.

FIG. 2 is a schematic block diagram of a voltage quality monitoring circuit. Shown in FIG. 2 are voltage quality monitoring circuit 50, power supply 52, power supply output 54, load 56, level detection circuit 60, level detection circuit output 62, voltage variation detection circuit 70, min/max capture circuit 71, voltage variation detection circuit output 72, controller 74, capture interval timer 75, configuration parameters 76, capture reset 77, input-output parameters 78, input-output module 80, load control signal 82, interrupt signal 84, voltage quality parameters 86, health monitoring system 88, and prognostic output 90. Power supply 52 provides power supply output 54 to load 56 having a nominal voltage level ($V_N$) with a tolerance value, as described above in regard to FIGS. 1A-1B. In some embodiments, power supply 52 can provide multiple power supply outputs 54 of differing nominal voltage levels ($V_N$), which can be referred to as monitored voltage(s). Load 56 can be referred to as a critical load, being a critical circuit component that can be adversely affected by a degradation in the quality of the voltage supplied from power supply 52. The voltage of power supply output 54 (i.e., the monitored voltage) is provided as an input to level detection circuit 60 and voltage variation detection circuit 70. Level detection circuit 60 can also be referred to as a voltage level monitoring circuit, which provides level detection circuit output 62. In the illustrated embodiment, level detection circuit output 62 is one of two values, as follows. When power supply 52 is providing a voltage at power supply output 54 that is between the lower voltage limit ($V_L$) and the upper voltage limit ($V_U$), level detection circuit output 62 is normal. When the voltage at power supply output 54 is below the lower voltage limit ($V_L$) or above the upper voltage limit ($V_U$), level detection circuit output 62 is a reset signal that indicates a fault in power supply 52, thereby resulting in a system reset and/or other action.

Voltage variation detection circuit 70 includes minimum/maximum (min/max) capture circuit 71 and monitors for the amplitude of variation in the voltage provided by power supply 52, in turn providing min/max values 72 as an output. Controller 74 includes capture interval timer 75, which receives min/max values 72. Capture interval timer 75 directs voltage variation detection circuit 70 to measure (i.e., capture) minimum and maximum values of power supply output 54 (i.e., monitored voltage) during a capture interval ($T_C$) that is determined by capture interval timer 75. The capture interval ($T_C$) is configurable by controller 74 (i.e., by capture interval timer 75), thereby defining a period of time over which the variation in power supply output 54 is analyzed. The capture interval ($T_C$) is determined as the time span between two consecutive capture reset 77 triggers generated by capture interval timer 75 and input to min/max capture circuit 71 as shown in FIG. 2. During a particular capture interval ($T_C$), the amplitude (i.e., magnitude) of the variation is the difference between the maximum and minimum voltage levels monitored. For the example illustrated in voltage vs. time plots 10, 10A shown in FIGS. 1A-1B pertaining to a switching power supply having a switching frequency of 100 KHz, the switching period $T_S$ is about 10 μsec. Accordingly, the switching ripple pp amplitude $S_{PP}$ can be determined by using a capture interval ($T_C$) of about 10 μsec. To eliminate sample aliasing, capture interval ($T_C$) can be set to a value that is greater than switching period $T_S$. In an embodiment, the ratio of capture interval ($T_C$) to switching period $T_S$ can range from about 1-5. In other embodiments, the ratio of capture interval ($T_C$) to switching period $T_S$ can be at least 1.2. In yet other embodiments, the ratio of capture interval ($T_C$) to switching period $T_S$ can be greater than 5. In any of these embodiments, the value of capture interval ($T_C$) and/or the ratio of capture interval ($T_C$) to switching period $T_S$ can be greater than the foregoing exemplary values. This can be referred to as voltage variation detection, whereby controller 74 relates a particular amplitude of voltage variation with an associated capture interval ($T_C$).

Referring again to FIG. 2 in reference to the example illustrated in voltage vs. time plots 10, 10A shown in FIGS. 1A-1B pertaining to a power supply having an exemplary subharmonic oscillation frequency ($F_H$) of about 1,000 Hz, the subharmonic period $T_H$ (i.e., $1/F_H$) is about 1 millisecond (1 msec.) Accordingly, subharmonic pp amplitude $H_{PP}$ can be determined using a capture interval ($T_C$) of about 1 msec. In an embodiment, the ratio of capture interval ($T_C$) to subharmonic period $T_H$ can range from about 1.2-5. In another embodiment, where the subharmonic oscillation frequency ($F_H$) is not known and/or can be variable, different values of capture interval ($T_C$) can be used. In some embodiments, capture interval timer 75 can be configured to sweep through various ranges of capture interval ($T_C$) during the operation of voltage quality monitoring circuit 50. For example, in an embodiment where subharmonic oscillation frequency ($F_H$) can range from about 200-5,000 Hz, capture interval timer 75 can vary capture interval ($T_C$) from about 200 μsec. (i.e., corresponding to $F_H$ of 5,000 Hz) to 5 msec. (i.e., corresponding to $F_H$ of 200 Hz). In another embodiment, capture interval timer 75 can use a capture interval ($T_C$) corresponding to an AC bus frequency that provides electrical input to power supply 52. This can be beneficial, for example, in monitoring a linear power supply. For example, an AC bus frequency ($F_B$) of 400 Hz having a corresponding AC bus frequency period $F_B$ of 2.5 msec. would have a capture interval ($T_C$) of about 2.5 msec. In any of the foregoing exemplary embodiments, capture interval ($T_C$) can be varied (i.e., swept) over practically any range that can extend from sub-microseconds to milliseconds, seconds, or longer. In any of these embodiments, the minimum value of capture interval ($T_C$) can be greater than the foregoing exemplary values. In any of these embodiments, controller 74 provides one or more quantifiable indices of power supply voltage quality in providing one or more amplitudes of voltage variation with an associated one or more capture intervals ($T_C$).

Controller 74 can include one or more processors having internal and/or connected memory and/or storage devices (not shown in FIG. 2). The one or more processors are configured to implement functionality and/or process instructions for execution within controller 74. The one or more processors can be capable of processing instructions stored in one or more storage device(s) (not shown in FIG. 2). Examples of processors can include any one or more of: a microprocessor, a microcontroller, a digital signal processor (DSP), an application specific integrated circuit (ASIC), a field-programmable gate array (FPGA), or other equivalent discrete or integrated logic circuitry. The connected memory and/or storage devices can be used to store measurements of amplitudes of voltage variation and their associated capture intervals ($T_C$). These measurements of amplitudes of voltage variation and their associated capture intervals ($T_C$) can be referred to as signals that are representative of the quality of the power supply voltage (i.e., monitored voltage). Voltage variation detection circuit output 72 is provided to controller 74 which monitors the quality of the power supply voltage. Controller 74 sends and receives input-output parameters 78 via input-output module 80, which can communicate with an external system. For example, controller 74 can receive input-output parameters 78 which are used to provide configuration parameters 76 to voltage variation detection circuit 70. Controller 74 is configured to provide load control signal 82 to load 56, thereby alerting load 56 of a degradation in the quality of the power supply voltage. Controller 74 also provides interrupt signal 84 if the quality of the monitored voltage degrades to a threshold value. For example, interrupt signal 84 could be generated if the amplitude associated with one or more capture intervals ($T_C$) exceeds a threshold. In the aforementioned exemplary embodiment, the amplitude is a peak-to-peak amplitude value (i.e., being a difference between a maximum and minimum voltage). In other embodiments, the amplitude can be referenced to being a base-to-peak value or a root-mean-square (RMS) value. In some embodiments, interrupt signal 84 can be referred to as an alert signal (i.e., alert) indicating that voltage variation detection circuit output 72 has provided an indication that the amplitude (i.e., level) of one or more monitored frequencies has exceeded an amplitude alert threshold.

Controller 74 also provides voltage quality parameters 86 to health monitoring system 88 which is configured to monitor, record, and evaluate a trend in the amplitudes of the one or more monitored frequencies. Health monitoring system 88 can be referred to as a prognostic processor. Health monitoring system 88 provides prognostic output 90 as an indication of the health of power supply 52. The data provided in prognostic output 90 can indicate to maintenance personnel the expected remaining useful life of power supply 52 and/or the need for preventive or corrective maintenance. In some embodiments, prognostic output 90 can indicate which particular components or subsystems in power supply 52 are degrading, thereby guiding maintenance personnel in the maintenance performed on power supply 52. Health monitoring system 88 can include one or more processors having internal and/or connected memory and/or storage devices (not shown in FIG. 2). The one or more processors are configured to implement functionality and/or process instructions for execution within health monitoring system 88. The one or more processors can be capable of processing instructions stored in one or more storage device(s) (not shown in FIG. 2). Examples of processors can include any one or more of: a microprocessor, a microcontroller, a digital signal processor (DSP), an application specific integrated circuit (ASIC), a field-programmable gate array (FPGA), or other equivalent discrete or integrated logic circuitry. In some embodiments, voltage variation detection circuit 70, controller 74, and/or health monitoring system 88 can be combined in the same one or more processors which can use the same one or more storage device(s).

Referring again to FIG. 2, in some embodiments, voltage variation detection circuit 70 can include one or more frequency filters (e.g., high pass filter, band pass filter) (not shown in FIG. 2) that selectively passes bands or ranges of frequencies to min/max capture circuit 71. These one or more frequency filters can be configurable, and they can be analog or digital. These one or more frequency filters (i.e., filters) can be configured to assist min/max capture circuit 71 in detecting one or more amplitudes of voltage variation with the associated one or more capture intervals ($T_C$). These embodiments will be described in more detail later, in FIG. 4. As used in the present disclosure, high pass and band pass filters define frequency ranges and bands that are passed being measured relative to a cutoff frequency or frequencies. A cutoff frequency can also be referred to as a pole and is measured at a −3 dB point.

Figure 3:
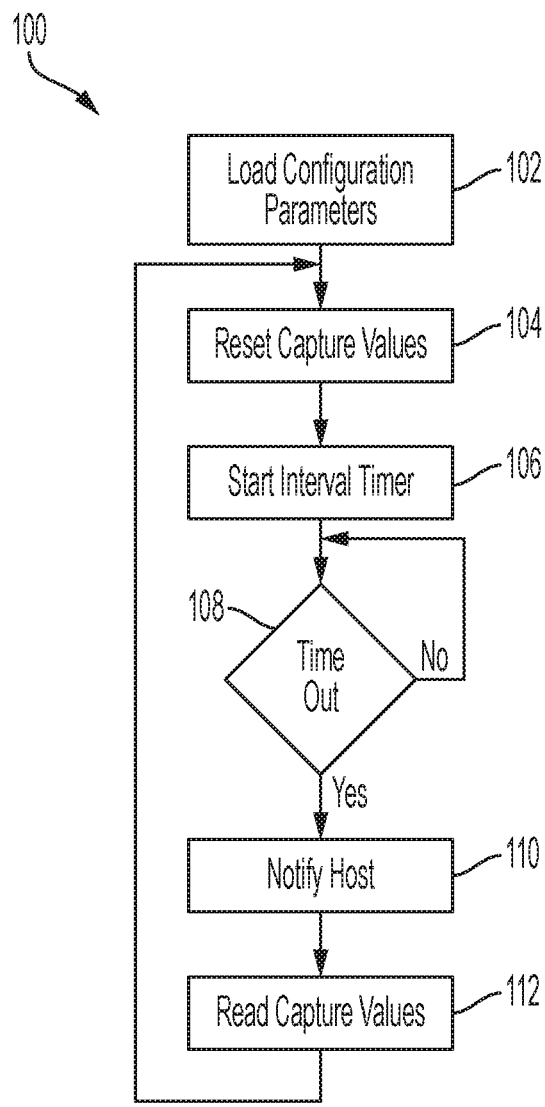
FIG. 3 is a flow chart showing the operation of the voltage quality monitoring circuit shown in FIG. 2.

FIG. 3 is a flow chart showing the operation of voltage quality monitoring circuit 50 shown in FIG. 2. Shown in FIG. 3 are flowchart 100, load configuration parameters step 102, reset capture values step 104, start interval timer step 106, time out decision 108, notify host step 110, and read capture values step 112. Flowchart 110 provides exemplary program steps of voltage quality monitoring circuit 50 that could be implemented in controller 74. Load configuration parameters step 102 is performed to establish the initial conditions for a particular operation of voltage quality monitoring circuit 50. Exemplary initial conditions include configuration parameters for one or more frequency filters that can be included in voltage variation detection circuit 70. Next, in reset capture values step 104, capture reset 77 triggers the start of a particular capture interval ($T_C$), as described above in regard to FIG. 2. Thereafter, start interval timer step 106 causes capture interval timer 75 to begin measuring time until a time out condition is achieved in time out decision step 108. An exemplary means of measuring time is by counting pulses from a system clock. Thereafter, notify host step 110 provides a signal indicative of the value of capture interval ($T_C$) that is commanded, while acquiring min/max values 72 in read capture values step 112. Taken together, the steps of reset capture values step 104, start interval timer step 106, time out decision 108, notify host step 110, and read capture values step 112 can be referred to as performing a capture cycle having capture interval ($T_C$). Thereafter, the capture cycle can be repeated over during the operation of voltage quality monitoring circuit 50, until controller 74 initiates another load configuration parameters step 102.

Figure 4:
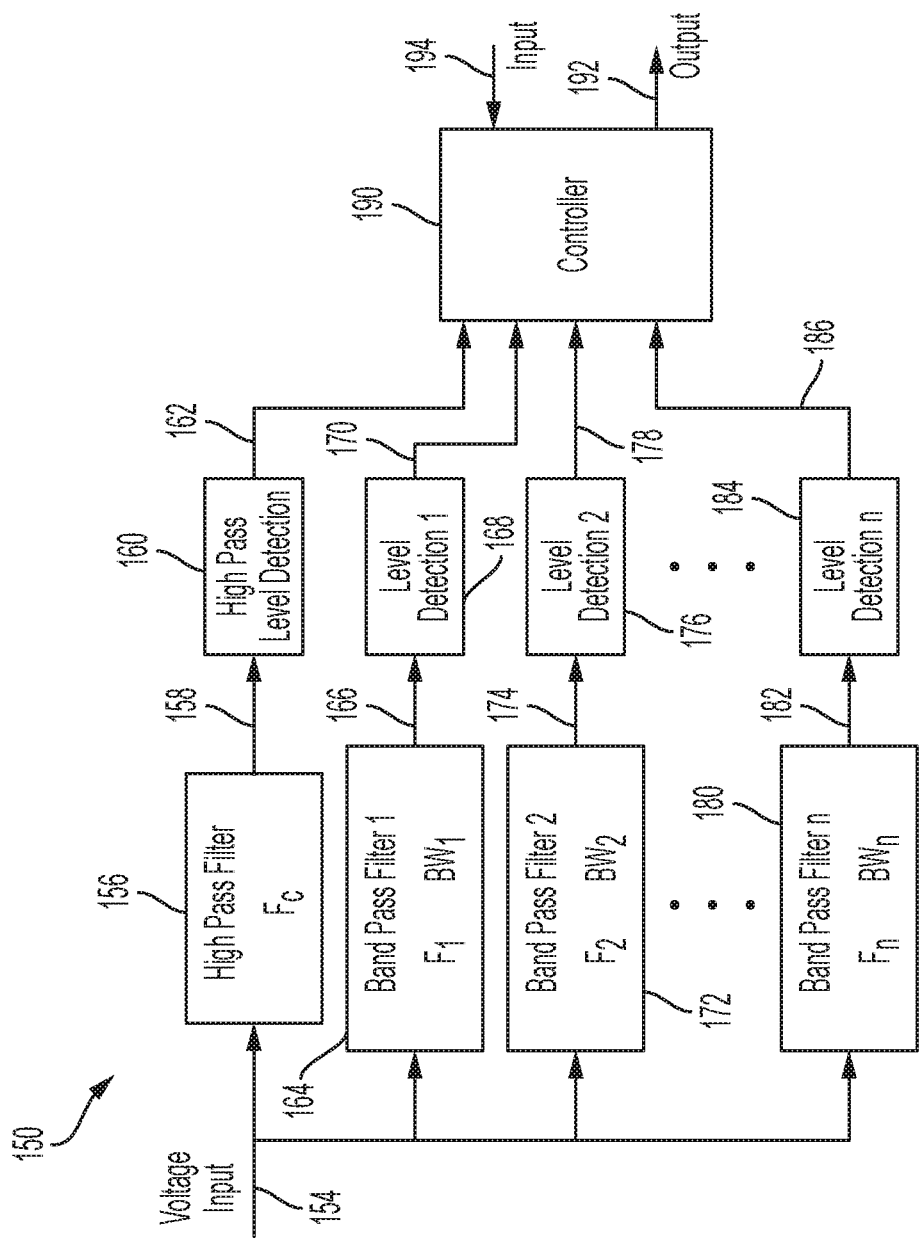
FIG. 4 is a schematic block diagram of a second embodiment of a voltage quality monitoring circuit.

FIG. 4 is a schematic block diagram of a second embodiment of a voltage quality monitoring circuit. Shown in FIG. 4 are voltage quality monitoring circuit 150, voltage input 154, high-pass filter 156 having cut-off frequency Fc, high-pass filter output 158, high-pass level detection circuit 160, high-pass level detection output 162, first band-pass filter

164 having first center frequency $F_1$ and first bandwidth $BW_n$, first band-pass filter output 166, first level detection circuit 168, first level detection output 170, second band-pass filter 172 having second center frequency $F_2$ and second bandwidth $BW_2$, second band-pass filter output 174, second level detection circuit 176, second level detection output 178, nth band-pass filter 180 having nth center frequency $F_n$ and nth bandwidth $BW_n$, nth band-pass filter output 182, nth level detection circuit 184, nth level detection output 186, controller 190, controller output 192, and controller input 194. Voltage quality monitoring circuit 150 depicts an exemplary instantiation of a configurable voltage variation detection circuit having a high-pass filter configured to detect noise spikes (i.e., transients) and a number of band pass filters each configured to detect a cyclic variation at a particular frequency. In the illustrated embodiment, a number n of band-pass filters is provided. FIG. 4 illustrates an embodiment of voltage quality monitoring circuit 150 having a number of discrete frequency filters, and does not include all other circuit components that were shown and discussed above in regard to FIGS. 2-3. In particular, a min/max capture circuit is not shown in each associated high-pass level detection circuit 160, first level detection circuit 168, second level detection circuit 176, . . . nth level detection circuit 184 (i.e., collectively, level detection circuits). Similarly, a capture interval timer is not shown in controller 190. During the operation of voltage quality monitoring circuit 150, controller 190 establishes one or more capture intervals ($T_C$) during which the amplitude (i.e., magnitude) of the variation provided by each level detection circuit is established.

Voltage input 154 is provided to high-pass filter 156 and to each of the n band-pass filters (i.e., first band-pass filter 164, second band-pass filter output 174, . . . nth band-pass filter 180). Cut-off frequency Fc of high-pass filter 156 is selected to pass signals associated with noise spikes through to high-pass filter output 158 while limiting other signals. An exemplary cut-off frequency Fc is 2 MHz. In various embodiments, cut-off frequency Fc can range from about 100 KHz-10 MHz. In some embodiments, cut-off frequency Fc can be less than 100 KHz or greater than 10 MHz. High-pass level detection circuit 160 provides high-pass level detection output 162 as being a representation of the amplitude (i.e., level) of noise spikes that are on voltage input 154. Each of the n band-pass filters (i.e., first band-pass filter 164, second band-pass filter output 174, . . . nth band-pass filter 180) has an associated center frequency and bandwidth (i.e., first center frequency $F_1$ and first bandwidth $BW_1$, second center frequency $F_2$ and second bandwidth $BW_2$, . . . nth center frequency $F_n$ and nth bandwidth $BW_n$) as shown in FIG. 4. The center frequency and bandwidth of each of the n band-pass filters can be configured to detect a particular cyclical variation in voltage input 154, as described above in regard to FIGS. 1A-1B. In an exemplary embodiment, first center frequency $F_1$ can be configured to match the power supply switching frequency, the description of which was provided above in regard to FIGS. 1A-1B. Accordingly, a non-limiting exemplary first center frequency $F_1$ is 100 KHz. First bandwidth $BW_1$ can be specified as being a percentage of first center frequency $F_1$. An exemplary percentage is 10%. Accordingly, with first center frequency $F_1$ of 100 KHz, first bandwidth $BW_1$ can be 10 KHz.

In an exemplary embodiment, second center frequency $F_2$ and second bandwidth $BW_2$ can be configured to match a known subharmonic oscillation frequency or range of possible subharmonic oscillation frequencies, as described above in regard to FIGS. 1A-1B. A non-limiting subharmonic oscillation frequency range is 200-5,000 Hz, thereby establishing second center frequency $F_2$ of 2,600 Hz and second bandwidth $BW_2$ of 2,400 Hz. In some embodiments, two or more band-pass filters can be configured to pass specific discrete frequencies that can be associated with subharmonic oscillation, each having a narrower bandwidth than that of the example described above.

In an exemplary embodiment, nth center frequency $F_n$ and nth bandwidth $BW_n$ can be configured to match an AC bus frequency associated with the power supply. An exemplary AC bus frequency is 400 Hz. Accordingly, a non-limiting exemplary nth center frequency $F_n$ is 400 Hz. Nth bandwidth $BW_n$ can be specified as being a percentage of nth center frequency $F_n$. An exemplary percentage is 10%. Accordingly, with nth center frequency $F_n$ of 400 Hz, nth bandwidth $BW_n$ can be 40 Hz.

Referring again to FIG. 4, each of the n band-pass filters (i.e., first band-pass filter 164, second band-pass filter output 174, . . . nth band-pass filter 180) has an associated band-pass filter output (i.e., first band-pass filter output 166, second band-pass filter output 174, . . . nth band-pass filter output 182) which is provided as an input to an associated level detection circuit (i.e., first level detection circuit 168, second level detection circuit 176, . . . nth level detection circuit 184) as shown in FIG. 4. Each level detection circuit provides an associated level detection output (i.e., first level detection output 170, second level detection output 178, . . . nth level detection output 186) that represents the amplitude (i.e., level) of the associated frequency or range of frequencies that were passed by the associated band-pass filter. In an embodiment, the amplitude can be a peak-to-peak amplitude value. In another embodiment, the amplitude can be a peak (i.e., base-to-peak) value. In yet another embodiment, the amplitude can be a RMS value. Each level detection output is provided as an input to controller 190, having one or more outputs 192 and one or more inputs 194. As noted earlier, controller 190 establishes one or more capture intervals ($T_C$) during which the amplitude of the variation provided by each level detection circuit is established. Because voltage quality monitoring circuit 150 shown in FIG. 4 includes one or more frequency filters, each being configurable to pass a band or range of frequencies of interest, it can be possible to use capture intervals ($T_C$) that are much longer than associated cyclic periods associated with a power supply (e.g., AC bus frequency period $F_B$, subharmonic period $T_H$, switching period $T_S$).

In the illustrated embodiment, the various filters (i.e., high-pass filter 156, first band-pass filter 164, second band-pass filter output 174, . . . nth band-pass filter 180) are depicted as being individual filter networks. In an exemplary embodiment, each individual filter network that can have one or more circuit elements that together function to perform a desired filtering function. Examples of individual filter networks that can be used include the following: inductor, capacitor, inductor-capacitor (i.e., L-C), inductor-capacitor-inductor (i.e., L-C-L, T-configuration), and capacitor-inductor-capacitor (i.e., C-L-C, π-configuration) which can provide the desired high-pass or band-pass function. Accordingly, configuration of voltage quality monitoring circuit 150 is performed by the selection of the various filter network elements. In another exemplary embodiment, each individual filter network can be an analog or digital filter that is configured digitally by controller 150 in a manner similar to that described above in regard to FIG. 2. This exemplary embodiment, the path of configuration parameters from controller 190 to the various filters is not shown. In yet another exemplary embodiment, voltage quality monitoring circuit 150 can include a single configurable filter that is periodically reconfigured during the operation of voltage quality monitoring circuit 150 to evaluate various frequencies or frequency bands. The single configurable filter can be a configurable analog filter block, a configurable digital filter, or a configurable hybrid analog-digital filter. Accordingly, in these exemplary embodiments, the single configurable filter can be referred to as a swept-frequency filter or as a multiplexed filter. Accordingly, a multiplexed level detection circuit can be used to provide an amplitude (i.e., level) of the associated multiplexed filter. In some embodiments, two or more configurable filters can be used to perform the filtering functionality so described, with each of the two or more configurable filters being configurable analog filters, configurable digital filters, configurable hybrid analog-digital filters, or any combinations thereof. Moreover, in some embodiments a combination of both fixed and configurable filters can be used.

In any of the foregoing exemplary embodiments, one or more processors (not shown in FIG. 3) can be configured to implement functionality and/or process instructions for performing the configuration of configurable filters (i.e., analog, digital, hybrid analog-digital), and/or for performing digital filtering. The one or more processors can be capable of processing instructions stored in one or more storage device(s) (not shown in FIG. 3). Examples of processors can include any one or more of: a microprocessor, a microcontroller, a digital signal processor (DSP), an application specific integrated circuit (ASIC), a field-programmable gate array (FPGA), or other equivalent discrete or integrated logic circuitry. Collectively, the filter networks and/or one or more digital filters can be referred to as a voltage variation detection circuit. In some embodiments, the digital filters and controller 190 can be combined in the same one or more processors which can use the same one or more storage device(s). In an exemplary embodiment, one or more digital filters could be used, whereby a digital processor samples raw voltage levels of voltage input 154, thereby providing multiple individual digital filters having a mix of high pass and band pass filters. In yet other exemplary embodiments, controller 190 could step through multiple filters, or could sweep through a frequency band of interest while providing a simple spectrum analysis output at controller output 192.

In some embodiments, voltage quality monitoring circuit 150 can monitor two or more voltages that are provided from the power supply. Accordingly, in these embodiments quality monitoring circuit 150 can be configured to sample different voltage inputs from one or more power supplies. These different voltage inputs can be the same and/or different voltage levels. This configuration can be referred to as voltage quality monitoring multiplexor. In any of the foregoing embodiments, voltage quality monitoring circuit 150 can include a health monitoring system having a description that can be substantially similar to that provided above in regard to FIG. 2.

The monitoring of voltage quality from any power supply, regardless of type (e.g., switching, linear, battery-based) is within the scope of the present disclosure, without regard to the source of the bus voltage supplied to the power supply or to the voltage(s) and associated power level(s) provided by the power supplies. In some embodiments, particularly when the power supply output voltage is greater than about 5 volts, voltage quality monitoring circuit 50, 150 can be used to monitor a scaled power supply output voltage. An exemplary means of scaling a power supply output voltage is by using a resistor divider network. In an exemplary embodiment, voltage quality monitoring circuit 50, 150 can be used to monitor one or more power supplies that are used aboard an aircraft to provide voltage(s) to a load. In other embodiments, the one or more monitored power supplies can be located on any type of vehicle, fixed, or mobile platform in which the quality of the power supply voltage(s) is important to a mission.

Discussion of Possible Embodiments

The following are non-exclusive descriptions of possible embodiments of the present invention.

A system for monitoring a quality of a voltage supplied by a power supply, the system comprising: a voltage variation detection module comprising: one or more level detection circuits, each configured to: receive a signal indicative of the voltage supplied by the power supply; and produce, based on the signal indicative of the voltage, an amplitude signal representative of a temporal variation in the voltage occurring during a capture interval; a controller, configured to: determine the capture interval; provide a capture control signal configured to cause the one or more level detection circuits to receive the signal indicative of the voltage during the capture interval determined; receive each of the respective amplitude signals from each of the one or more level detection circuits; and produce, based on the respective amplitude signals received, one or more output signals that is representative of the respective amplitude signals and the associated capture interval; wherein the one or more output signals is indicative of the quality of the voltage.

The system of the preceding paragraph can optionally include, additionally and/or alternatively, any one or more of the following features, configurations and/or additional components:

A further embodiment of the foregoing system, wherein the one or more output signals comprise an alert indicating that one or more of the amplitude signals exceeds an associated amplitude alert threshold.

A further embodiment of the foregoing system, wherein the controller is further configured to provide an interrupt signal when triggered by the one or more alerts.

A further embodiment of the foregoing system, wherein the voltage variation detection module further comprises a minimum/maximum (min/max) capture circuit; the controller further comprises a capture interval timer configured to determine the capture period; and the min/max capture circuit calculates a respective amplitude signal by evaluating the difference between a maximum and a minimum voltage level occurring during the determined capture interval.

A further embodiment of the foregoing system, wherein: a cyclic variation in the voltage defines a cyclic period; and a ratio of the capture interval to the cyclic period is between 1-5.

A further embodiment of the foregoing system, wherein the cyclic period is a period of a subharmonic oscillation of the power supply.

A further embodiment of the foregoing system, wherein: the power supply is a switching power supply having a switching frequency; and the cyclic variation has a corresponding period associated with the switching frequency.

A further embodiment of the foregoing system, wherein: the power supply receives power from an AC bus having a bus frequency; and the cyclic variation has a corresponding period associated with the bus frequency.

A further embodiment of the foregoing system, further comprising a health monitoring system configured to: receive the or more output signals from the controller; and generate a trend, based on the one or more output signals received, in the one or more output signals over time.

A further embodiment of the foregoing system, further comprising a voltage level monitoring circuit that is configured to provide an error signal if the voltage is: less than a predetermined lower voltage limit; or greater than a predetermined upper voltage limit.

A further embodiment of the foregoing system, wherein: the voltage variation detection module further comprises one or more frequency filters corresponding to each of the one or more level detection circuits; and each of the one or more frequency filters is configured to: receive the voltage supplied by the power supply; and pass a signal indicative of a range of frequencies to the associated one or more level detection circuits; wherein each of the one or more frequency filters is a high-pass filter or a band-pass filter that is configured to adapt one or more pole frequencies to correspond with the signal indicative of the range of frequencies received.

A further embodiment of the foregoing system, wherein at least one of the one or more frequency filters is a high-pass filter that is configured to pass voltage transient spikes to the associated level detection circuit.

A further embodiment of the foregoing system, wherein at least one of the one or more frequency filters is a band-pass filter that is configured to pass a range of frequencies associated with a subharmonic oscillation of the power supply.

A further embodiment of the foregoing system, wherein: the power supply receives power from an AC bus having a bus frequency; and at least one of the one or more frequency filters is a band-pass filter that is configured to pass a range of frequencies associated with the bus frequency.

A further embodiment of the foregoing system, wherein: the power supply is a switching power supply having a switching frequency; and at least one of the one or more frequency filters is a band-pass filter that is configured to pass a range of frequencies associated with the switching frequency.

A further embodiment of the foregoing system, wherein: the one or more frequency filters is configurable; the voltage variation detection module is configured to receive one or more configuration parameters from the controller, thereby configuring the one or more frequency filters; the one or more configuration parameters comprise one or more of a cut-off frequency, a center frequency, and a frequency bandwidth; and the one or more configuration parameters cause the one or more frequency filters to pass a range of frequencies associated with one or more cyclic variations in the voltage.

A further embodiment of the foregoing system, wherein the amplitude signal is representative of an amplitude that is selected from: a peak-to-peak amplitude, a base-to-peak amplitude, and a root mean square amplitude.

A method of using a system comprising a controller and a voltage variation detection module that includes one or more level detection circuits to monitor a quality of a voltage supplied by a power supply, the method comprising: determining, by the controller, a capture interval; providing to each of the one or more level detection circuits, by the controller, an indication of the capture interval; receiving, by the one or more level detection circuits, a signal indicative of the voltage during the capture interval determined; producing, by the one or more level detection circuits, an amplitude signal representative of a temporal variation in the voltage occurring during the capture interval; receiving, by the controller, the one or more amplitude signals; and producing, by the controller, one or more output signals that are representative of the amplitude signals and the associated capture interval; wherein the one or more output signals is indicative of the quality of the voltage.

The method of the preceding paragraph can optionally include, additionally and/or alternatively, any one or more of the following features, configurations and/or additional components:

A further embodiment of the foregoing method, wherein the voltage variation detection module further comprises a minimum/maximum (min/max) capture circuit and the system further comprises a health monitoring system, the method further comprising: calculating, by the min/max capture circuit, a respective amplitude signal by evaluating the difference between a maximum and a minimum voltage level occurring during the determined capture interval; receiving, by the health monitoring system, the one or more output signals from the controller; and generating, by the health monitoring system, a trend in the one or more output signals over time.

A further embodiment of the foregoing method, wherein voltage variation detection module further comprises one or more frequency filters corresponding to each of the one or more level detection circuits, the method further comprising: receiving, by each of the one or more frequency filters, the voltage supplied by the power supply; and passing, by each of the one or more frequency filters, a signal indicative of a range of frequencies to the associated one or more level detection circuits; wherein each of the one or more frequency filters is a high-pass filter or a band-pass filter that is configured to adapt one or more pole frequencies to correspond with the signal indicative of the range of frequencies received.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for monitoring a quality of a voltage supplied by a power supply, the system comprising:
   a voltage variation detection module comprising:
      one or more level detection circuits, each configured to:
         receive a signal indicative of the voltage supplied by the power supply; and
         produce, based on the signal indicative of the voltage, an amplitude signal representative of a temporal variation in the voltage occurring during a capture interval;
   a controller, configured to:
      determine the capture interval;
      provide a capture control signal configured to cause the one or more level detection circuits to receive the signal indicative of the voltage during the capture interval;
      receive each of the respective amplitude signals from each of the one or more level detection circuits; and
      produce, based on the respective amplitude signals received, one or more output signals that is representative of the respective amplitude signals and the associated capture interval;
wherein the one or more output signals is indicative of the quality of the voltage.

2. The system of claim 1, wherein the one or more output signals comprise an alert indicating that one or more of the amplitude signals exceeds an associated amplitude alert threshold.

3. The system of claim 1, wherein the controller is further configured to provide an interrupt signal when triggered by the one or more alerts.

4. The system of claim 1, wherein:
the voltage variation detection module further comprises a minimum/maximum (min/max) capture circuit;
the controller further comprises a capture interval timer configured to determine the capture period; and
the min/max capture circuit calculates a respective amplitude signal by evaluating the difference between a maximum and a minimum voltage level occurring during the determined capture interval.

5. The system of claim 4, wherein:
a cyclic variation in the voltage defines a cyclic period; and
a ratio of the capture interval to the cyclic period is between 1-5.

6. The system of claim 4, wherein the cyclic period is a period of a subharmonic oscillation of the power supply.

7. The system of claim 4, wherein:
the power supply is a switching power supply having a switching frequency; and
the cyclic variation has a corresponding period associated with the switching frequency.

8. The system of claim 4, wherein:
the power supply receives power from an AC bus having a bus frequency; and
the cyclic variation has a corresponding period associated with the bus frequency.

9. The system of claim 1, further comprising a health monitoring system configured to:
receive the or more output signals from the controller; and
generate a trend, based on the one or more output signals received, in the one or more output signals over time.

10. The system of claim 1, further comprising a voltage level monitoring circuit that is configured to provide an error signal if the voltage is:
less than a predetermined lower voltage limit; or
greater than a predetermined upper voltage limit.

11. The system of claim 1, wherein:
the voltage variation detection module further comprises one or more frequency filters corresponding to each of the one or more level detection circuits; and
each of the one or more frequency filters is configured to:
receive the voltage supplied by the power supply; and
pass a signal indicative of a range of frequencies to the associated one or more level detection circuits;
wherein each of the one or more frequency filters is a high-pass filter or a band-pass filter that is configured to adapt one or more pole frequencies to correspond with the signal indicative of the range of frequencies received.

12. The system of claim 11, wherein at least one of the one or more frequency filters is a high-pass filter that is configured to pass voltage transient spikes to the associated level detection circuit.

13. The system of claim 11, wherein at least one of the one or more frequency filters is a band-pass filter that is configured to pass a range of frequencies associated with a subharmonic oscillation of the power supply.

14. The system of claim 11, wherein:
the power supply receives power from an AC bus having a bus frequency; and
at least one of the one or more frequency filters is a band-pass filter that is configured to pass a range of frequencies associated with the bus frequency.

15. The system of claim 11, wherein:
the power supply is a switching power supply having a switching frequency; and
at least one of the one or more frequency filters is a band-pass filter that is configured to pass a range of frequencies associated with the switching frequency.

16. The system of claim 11, wherein:
the one or more frequency filters is configurable;
the voltage variation detection module is configured to receive one or more configuration parameters from the controller, thereby configuring the one or more frequency filters;
the one or more configuration parameters comprise one or more of a cut-off frequency, a center frequency, and a frequency bandwidth; and
the one or more configuration parameters cause the one or more frequency filters to pass a range of frequencies associated with one or more cyclic variations in the voltage.

17. The system of claim 1, wherein the amplitude signal is representative of an amplitude that is selected from: a peak-to-peak amplitude, a base-to-peak amplitude, and a root mean square amplitude.

18. A method of using a system comprising a controller and a voltage variation detection module that includes one or more level detection circuits to monitor a quality of a voltage supplied by a power supply, the method comprising:
determining, by the controller, a capture interval;
providing to each of the one or more level detection circuits, by the controller, an indication of the capture interval;
receiving, by the one or more level detection circuits, a signal indicative of the voltage during the capture interval;
producing, by the one or more level detection circuits, an amplitude signal representative of a temporal variation in the voltage occurring during the capture interval;
receiving, by the controller, the one or more amplitude signals; and
producing, by the controller, one or more output signals that are representative of the amplitude signals and the associated capture interval;
wherein the one or more output signals is indicative of the quality of the voltage.

19. The method of claim 18, wherein the voltage variation detection module further comprises a minimum/maximum (min/max) capture circuit and the system further comprises a health monitoring system, the method further comprising:
calculating, by the min/max capture circuit, a respective amplitude signal by evaluating the difference between a maximum and a minimum voltage level occurring during the determined capture interval;
receiving, by the health monitoring system, the one or more output signals from the controller; and
generating, by the health monitoring system, a trend in the one or more output signals over time.

20. The method of claim 18, wherein voltage variation detection module further comprises one or more frequency filters corresponding to each of the one or more level detection circuits, the method further comprising:

receiving, by each of the one or more frequency filters, the voltage supplied by the power supply; and passing, by each of the one or more frequency filters, a signal indicative of a range of frequencies to the associated one or more level detection circuits;

wherein each of the one or more frequency filters is a high-pass filter or a band-pass filter that is configured to adapt one or more pole frequencies to correspond with the signal indicative of the range of frequencies received.

* * * * *